United States Patent [19]

Sago et al.

[11] Patent Number: 5,116,250
[45] Date of Patent: May 26, 1992

[54] METHOD AND APPARATUS FOR APPLYING A COATING MATERIAL TO A SUBSTRATE

[75] Inventors: Hiroyoshi Sago; Hideyuki Mizuki; Katsuhiko Kudo, all of Kanagawa; Muneo Nakayama, Tokyo, all of Japan

[73] Assignee: Tokyo Ohka Kogyo Co., Ltd., Kanagawa, Japan

[21] Appl. No.: 246,403

[22] Filed: Sep. 19, 1988

[30] Foreign Application Priority Data

Sep. 18, 1987 [JP] Japan .................. 62-234054

[51] Int. Cl.[5] .................. B05C 11/023; B05D 3/12
[52] U.S. Cl. .................. 118/52; 118/320; 427/240; 427/348
[58] Field of Search .................. 427/240, 348; 118/52, 118/320

[56] References Cited

U.S. PATENT DOCUMENTS

| 4,510,176 | 4/1985 | Cuthbert et al. ............ 427/240 |
| 4,528,934 | 7/1985 | Nakayama ............ 118/52 |
| 4,587,139 | 5/1986 | Hagen et al. ............ 427/240 |
| 4,790,262 | 12/1988 | Nakayama et al. ............ 118/52 |

FOREIGN PATENT DOCUMENTS

| 2026618 | 12/1971 | Fed. Rep. of Germany ...... 427/348 |
| 5376748 | 7/1978 | Japan .................. 427/348 |
| 5544780 | 3/1980 | Japan .................. 427/348 |
| 5559724 | 5/1986 | Japan .................. 427/348 |

OTHER PUBLICATIONS

Wetz, IBM Technical Disclosure Bulletin, vol. 19, No. 6, Nov. 1976, pp. 2114-2115.

*Primary Examiner*—Shrive Beck
*Attorney, Agent, or Firm*—Irving M. Weiner; Joseph P. Carrier; Pamela S. Burt

[57] ABSTRACT

A coating apparatus comprises a spinning chuck rotatably supported within an enclosure and securely holding a substrate thereon. A coating material is applied onto the surface of the substrate and distributed over the substrate by centrifugal forces. An annular air duct is disposed in surrounding and spaced relation to the spinning chuck, and a disk is placed between the air duct and the spinning chuck and has a plurality of guide vanes. Fans are provided in the air duct to develop a positive flow of air over the substrate. The flow of air is guided by the guide vanes in a direction identical to the direction of rotation of the substrate so as to eliminate undesirable deposition from the end edges of the substrate.

4 Claims, 3 Drawing Sheets

METHOD AND APPARATUS FOR APPLYING A COATING MATERIAL TO A SUBSTRATE

BACKGROUND OF THE INVENTION

1. Field of the Invention

This invention relates to methods and apparatus for applying a coating material such as a photoresist masking material to a substrate such as a semiconductor wafer or glass.

2. Description of the Related Art

Japanese utility model publication No. 60-95979, open to public inspection on Jun. 29, 1985, discloses an automated spin coater which includes an enclosure within which a spinner chuck is supported for rotation by a motor. The spinner chuck has a vacuum table on which a semiconductor wafer is securely held by vacuum action. A photoresist coating material is applied to the semiconductor wafer which is spun to coat it evenly by centrifugal forces.

When a substrate to be coated is of a shape other than round, a coating material is likely to be deposited at corners of the substrate due to wind pressure. Such undesirable deposition or uneven coating on the substrate may subsequently result in the malfunction during further processing or use of the substrate and therefore, may also result in a serious decrease in the yield of acceptably coated substrates.

SUMMARY OF THE INVENTION

It is, therefore, an object of the invention to provide a method and apparatus for applying a coating material to a substrate, wherein an even coating can be provided over the entire surface of the substrate.

According to one aspect of the invention, there is provided a method for applying a coating material to a substrate, comprising the steps of spinning the substrate, applying the coating material onto the surface of the substrate, and developing and guiding a flow of air over the substrate in a direction identical to the direction of rotation of the substrate.

According to another aspect of the invention, there is provided an apparatus for applying a coating material to a substrate, which comprises an enclosure, a spinning chuck rotatably supported within the enclosure and having a vacuum table on which the substrate is securely held, means for applying the coating material onto the surface of the substrate, means for developing a flow of air over the substrate, and means for guiding the flow of air in a direction identical to the direction of rotation of the substrate.

In a preferred embodiment, the air guide means includes an annular air duct disposed in surrounding and spaced relation to the spinning chuck, and a fixed disk disposed between the air duct and the spinning chuck and having a plurality of guide vanes thereon. The flow of air is developed by fans mounted within the air duct and guided by the guide vanes, to eliminate undesirable deposition from the end edge or periphery of the substrate. The flow of air may alternatively be developed by a vacuum system having vacuum lines adapted to connect the air duct with vacuum sources.

BRIEF DESCRIPTION OF THE DRAWINGS

A better understanding of the invention may be had by reference to the following description of preferred embodiments when taken in conjunction with the accompanying drawings; in which.

DESCRIPTION OF THE PREFERRED EMBODIMENTS

Figure 1:
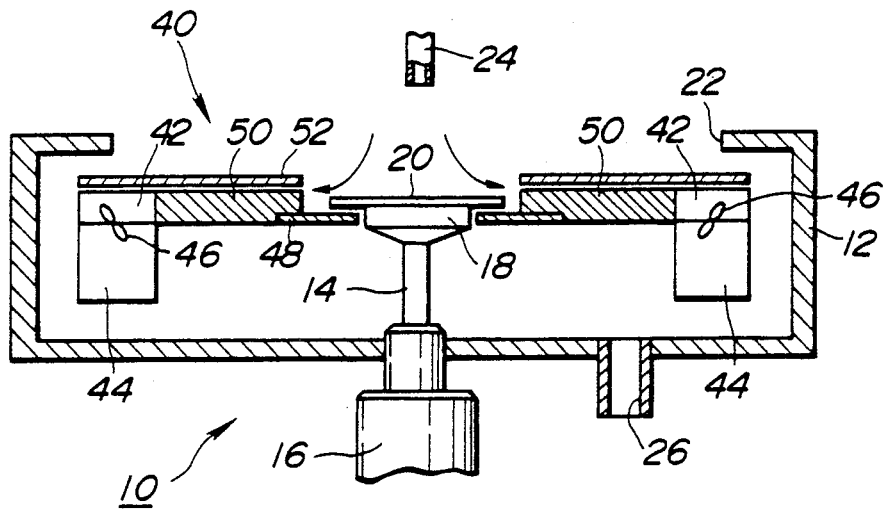
FIG. 1 is a vertical section of a coating apparatus designed in accordance with the principles of the invention.

Referring now to the drawings and first to FIG. 1, there is shown a coating apparatus or automatic spin coater indicated generally by the numeral 10 and having an enclosure 12. Centrally disposed within the enclosure 12 is a spinning chuck 14 which is connected for rotation by an electric motor 16. A vacuum table 18 is fixed at its center to the spinning chuck 14 and also, coupled to a vacuum source (not shown) to thereby securely hold a square semiconductive or silicon substrate 20 thereon. Upon energization of the motor 16, the vacuum table 18, together with the semiconductive substrate 20, is rotated at a rate in the range of 1000 to 6000 rpm. The enclosure 12 is centrally open as at 22 through which a photoresist masking material, or other coating material is applied to the top surface of the semiconductive substrate 20 by a nozzle 24 of a conventional dispensing device. Liquid residues as radially broadcast by centrifugal forces flow out of the enclosure 12 through a drainage outlet 26.

Figure 2:
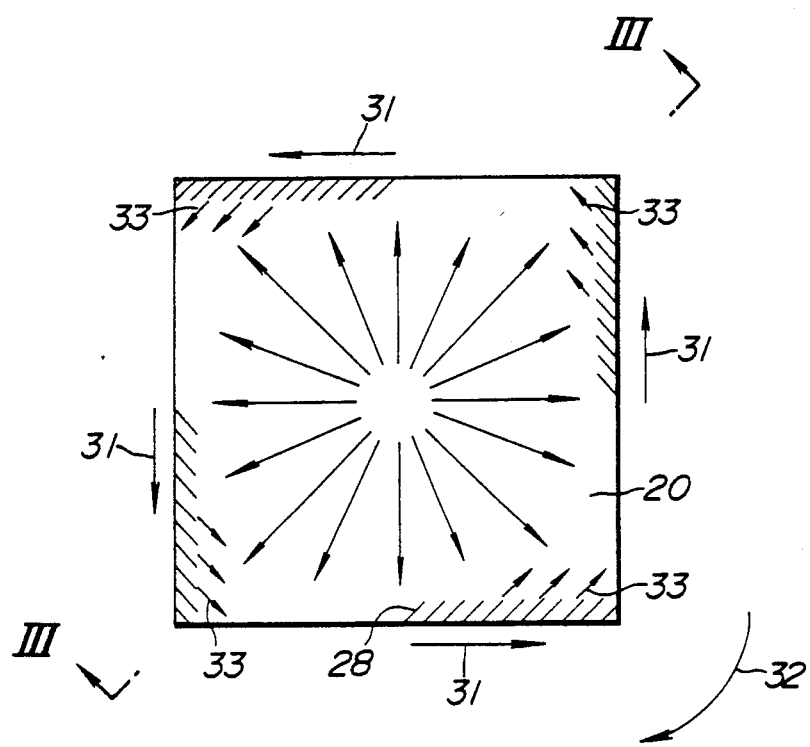
FIG. 2 is a schematic plan view of a semiconductive substrate, showing how a coating liquid as applied thereto flows when the substrate is rotated.
Figure 3:
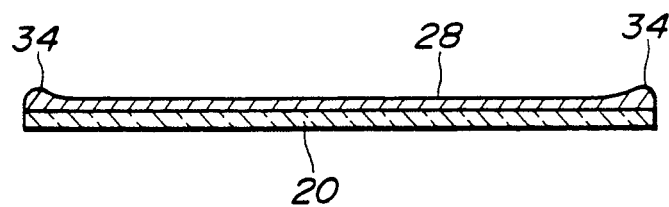
FIG. 3 is a sectional view taken along the line III—III of FIG. 2.

When a substrate is circular in shape, a coating or masking material, spread to the edge of the substrate by centrifugal forces, can be ejected from the periphery of the substrate in a direction tangentially of the substrate. This provides even coating over the entire surface of the substrate. When the square substrate is used, this is not the case. As shown in FIG. 2, a coating material 28, spread to the edge of the substrate 20, flows in a direction (arrow 31) opposite to the direction of rotation of the substrate (arrow 32) along its side edges and then travels in a direction as indicated by arrow 33. This results in an undesirable deposition or formation of raised portions 34 at each corner of the substrate 20 (see FIG. 3).

In order to eliminate such undesirable deposition and provide even coating over the entire surface of the substrate, there is provided an air guide assembly as indicated generally by the numeral 40. Specifically, an annular air duct 42 is located circumferentially about and spaced from the vacuum table 18 and has diametrically opposite outlets 44,44. Fans 46,46 are mounted in the air duct 42 adjacent to the outlets 44,44, respectively and are driven by suitable drive means, such as electric motors (not shown) to develop adequate air flow over the substrate 20. Situated between the air duct 42 and the vacuum table 18 is a fixed disk 48 on which a plurality of, preferably 15 to 16 guide vanes or fins 50. The fixed disk 48 is centrally open to permit access of the vacuum table 18 to the enclosure 12. Illustratively, the guide vanes 50 extend in a direction tangentially of the vacuum table 18. A cover 52 is provided over the guide vanes 50 and the air duct 42.

In use, the substrate 20 is either manually or automatically loaded centrally on the vacuum table 18 and is pulled into mating engagement with the vacuum table 18 by vacuum action. The photoresist masking material is then applied to the top surface of the substrate 20 by the nozzle 24. Thereafter, the motor 16 is energized to spin the vacuum table 18, together with the substrate 20 securely held thereon, in a direction as shown by arrow 53 in FIG. 4. A centrifugal flow component is imparted to the liquid masking material causing it to spread over the top surface of the substrate 20. At the same time, the motors are energized to rotate the fans 46,46 to develop air flow over the substrate 20, the air flowing from the center to the end edges of the substrate 20 in a direction identical to the direction of rotation of the substrate 20 as shown by arrow 56. This air flow serves to eject undesirable deposition from the end edges of the substrate 20 so as to provide even coating over the entire surface of the substrate 20.

Figure 4:
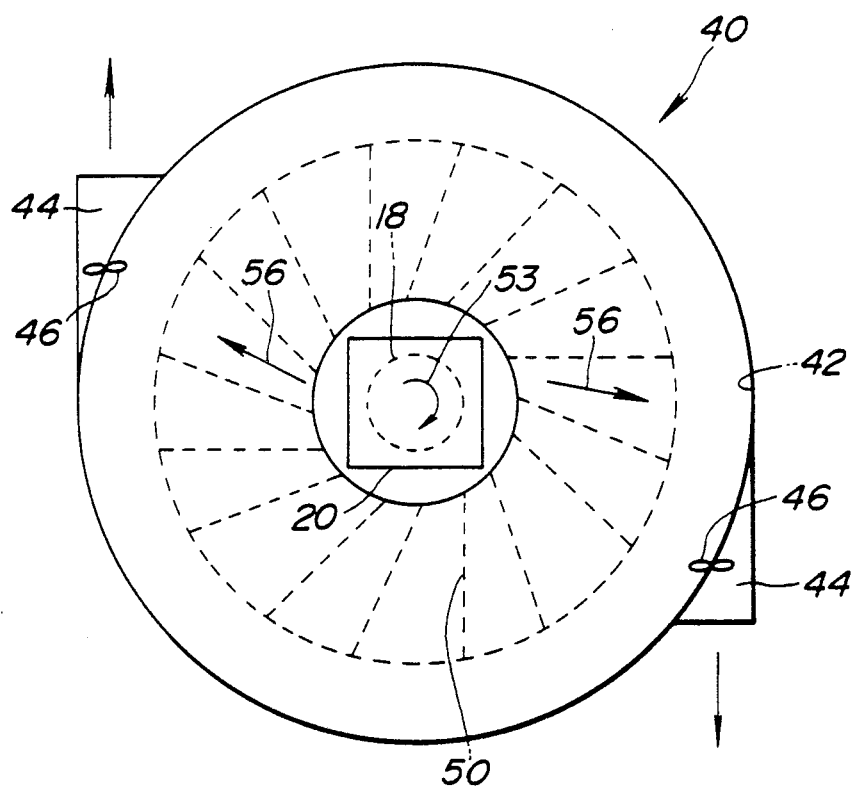
FIG. 4 is a schematic plan view of the coating apparatus with a cover removed for clarity.
Figure 5:
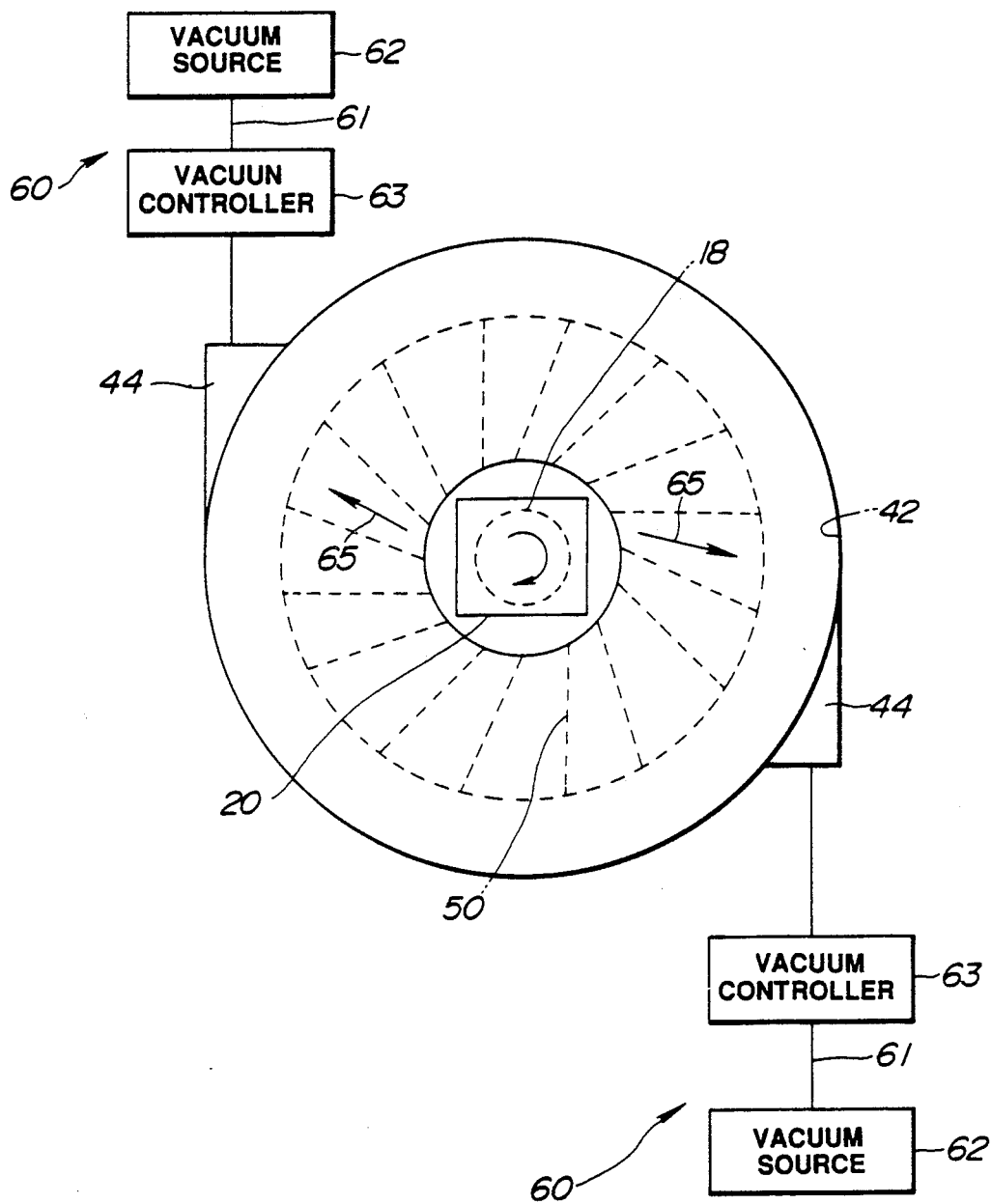
FIG. 5 is a view similar to FIG. 4, but showing a modification.

With reference to FIG. 5, a vacuum system 60 may alternatively be provided, in place of the fans 46,46 shown in FIG. 4. Common elements in FIGS. 4 and 5 have the same identifying numerals. Illustratively, the vacuum system 60 includes two separate vacuum lines 61 adapted to connect the outlets 44 with two corresponding vacuum sources 62 through vacuum controllers 63. Similar air flow, as indicated by arrow 65, is developed by vacuum action so as to eject undesirable deposition from the end edges of the substrate 20.

While the invention has been described with respect to preferred embodiments, further modifications may be made without departing from the scope and spirit of the invention. It is intended to cover such modifications as fall within the scope of the appended claims.

What is claimed is:

1. An apparatus for applying a coating material to a substrate, comprising:
    an enclosure;
    a spinning chuck rotatably supported within the enclosure and having a vacuum table on which a substrate is securely held;
    means for applying a coating material onto a surface of the substrate;
    means for developing a flow of air over the substrate; and
    means for guiding said flow of air in a direction identical to the direction of rotation of the substrate, said guiding means including an annular air duct disposed in surrounding and spaced relation to the spinning chuck and having outlets, and a fixed disk disposed between the air duct and the spinning chuck and having a plurality of guide vanes thereon.

2. The apparatus of claim 1, wherein said air flow developing means includes fans mounted within the air duct adjacent to said outlets thereof.

3. The apparatus of claim 1, wherein said air flow developing means includes a vacuum system having vacuum lines, each vacuum line being adapted to connect one of said outlets of the air duct with a vacuum source.

4. The apparatus of claim 1, wherein said guide vanes extend in a direction tangentially of the vacuum table.

* * * * *

UNITED STATES PATENT AND TRADEMARK OFFICE
CERTIFICATE OF CORRECTION

PATENT NO. : 5,116,250
DATED : May 26, 1992
INVENTOR(S) : Hiroyoshi Sago; Hideyuki Mizuki; Katsuhiko Kudo; and Muneo Nakayama It is certified that error appears in the above-identified patent and that said Letters Patent is hereby corrected as shown below:

Column 1, line 26, change "the malfunction" to -- malfunctions --.
Column 2, line 32, change "material is" to -- material, is --.

Signed and Sealed this

Thirteenth Day of July, 1993

Attest:

MICHAEL K. KIRK

*Attesting Officer*   Acting Commissioner of Patents and Trademarks